(12) United States Patent
Yoneda

(10) Patent No.: US 6,512,409 B2
(45) Date of Patent: Jan. 28, 2003

(54) SIGNAL SWITCHING CIRCUIT WITH REDUCED NUMBER OF DIODES USED

(75) Inventor: Toshiharu Yoneda, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/997,565

(22) Filed: Nov. 28, 2001

(65) Prior Publication Data
US 2002/0063593 A1 May 30, 2002

(30) Foreign Application Priority Data
Nov. 29, 2000 (JP) ........................................ 2000-367751

(51) Int. Cl.[7] .............................................. H03K 17/76
(52) U.S. Cl. ......................... 327/407; 327/99; 327/504; 333/104
(58) Field of Search ........................... 327/99, 365, 407, 327/493, 504, 505; 333/103, 104; 307/113, 115, 139

(56) References Cited

U.S. PATENT DOCUMENTS 5,327,017 A * 7/1994 Fischer et al. .............. 327/407

FOREIGN PATENT DOCUMENTS

JP 2000-224517 8/2000 ............ H04N/5/63

* cited by examiner

Primary Examiner—Timothy P. Callahan
Assistant Examiner—Terry L. Englund
(74) Attorney, Agent, or Firm—Brinks Hofer Gilson & Lione

(57) ABSTRACT

A signal switching circuit has first to fourth diode pairs each comprising two series-connected diodes disposed respectively between a first input terminal and a first output terminal, between a second input terminal and the first output terminal, between the first input terminal and the second output terminal, and between the second input terminal and the second output terminal, and first to fourth capacitor circuits connected respectively between diode-to-diode connection points in the diode pairs and the ground. The first or second diode pair is rendered conductive in an alternative manner. Likewise, the third or fourth diode pair is rendered conductive in an alternative manner. A low pass filter for passing therethrough the corresponding first or second signal uses residual inductance in each of the diode pairs thus rendered conductive and the associated capacitor circuit.

3 Claims, 3 Drawing Sheets

SIGNAL SWITCHING CIRCUIT WITH REDUCED NUMBER OF DIODES USED

BACKGROUND OF THE INVENTION

1. Field of the Invention

The present invention relates to a signal switching circuit, for example a signal switching circuit suitable for use in a satellite broadcast receiving outdoor converter in which satellite broadcast signals of counterclockwise and clockwise circularly polarized waves are outputted arbitrarily to two output terminals.

2. Description of the Related Art

A conventional signal switching circuit will now be described with reference to FIGS. 5 and 6. First, FIG. 5 illustrates a block configuration, in which a first signal, say, a satellite broadcast signal of a counterclockwise circularly polarized wave, is inputted to a first input terminal 51 and a second signal, say, a satellite broadcast signal of a clockwise circularly polarized wave, is inputted to a second input terminal 52. These signals are inputted from a down converter (not shown).

The first signal is inputted through the first input terminal 51 to both a first terminal 55a of a first switch circuit 55 and a first terminal 56a of a second switch circuit 56, while the second signal is inputted through the second input terminal 52 to both a second terminal 55b of the first switch circuit 55 and a second terminal 56b of the second switch circuit 56. One of the two signals is selected in each of the switch circuits 55 and 56 and the selected signals are outputted respectively to third terminals 55c and 56c of the switch circuits 55 and 56 and are then outputted respectively to a first output terminal 53 and a second output terminal 54.

The first and second switch circuits 55 and 56 are of the same configuration, which is illustrated in FIG. 6 (only the first switch circuit 55 is shown). Two diodes 61 and 62, which are connected together in series, are disposed between the first and third terminals 55a, 55c in such a manner that their cathodes and anodes are located on the first terminal 55a side and the third terminal 55c side, respectively. A connection point between the two diodes 61 and 62 is connected to the anode of a diode 64 through a DC cut-off capacitor 63, the cathode of the diode 64 being grounded high-frequencywise by means of a DC cut-off capacitor 65.

Two diodes 66 and 67, which are connected together in series, are disposed between the second and third terminals 55b, 55c in such a manner that their cathodes and anodes lie on the second terminal 55b side and the third terminal 55c side, respectively. A connection point between the two diodes 66 and 67 is connected to the cathode of a diode 69 through a DC cut-off capacitor 68, the anode of the diode 69 being grounded high-frequencywise by means of the DC cut-off capacitor 65.

Voltage E is applied to the anodes of the diodes 62 and 67 through a resistor 70. The cathode of the diode 61, the anode of the diode 64, and the cathode of the diode 69 are connected to a first voltage application terminal 74 through resistors 71, 72, and 73, respectively. The cathode of the diode 66 and a connection point between the diodes 64 and 69 are connected to a second voltage application terminal 77 through resistors 75 and 76, respectively. The voltage E is applied to the first and second voltage application terminals 74, 77 while switching polarity by means of a change-over switch 78 of a two-circuit two-contact configuration.

When the voltage E is applied to the first voltage application terminal 74 and the second voltage application terminal 77 is grounded, the diodes 61 and 62 turn OFF and the diode 64 turns ON. Further, the diodes 66 and 67 turn ON and the diode 69 turns OFF. As a result, the second signal which has been inputted to the second terminal 55b is outputted to the third terminal 55c. At this time, the first signal which has been inputted to the first terminal 55a is not outputted.

When the first voltage application terminal 74 is grounded and the voltage E is applied to the second voltage application terminal 77, the diodes 61 and 62 turn ON and the diode 64 turns OFF. Further, the diodes 66 and 67 turn OFF and the diode 69 turns ON. As a result, the first signal which has been inputted to the first terminal 55a is outputted to the third terminal 55c. At this time, the second signal which has been inputted to the second terminal 55b is not outputted.

Thus, the first signal inputted to the first input terminal 51 or the second signal inputted to the second input terminal 52 is outputted to the first output terminal 53 by the first switch circuit 55.

Likewise, the first signal inputted to the first input terminal 51 or the second signal inputted to the second input terminal 52 is outputted to the second output terminal 54 by the second switch circuit 56.

In the conventional configuration described above there are used six diodes for outputting the first or the second signal to the first output terminal 53. Likewise, the same number of diodes are used for outputting the first or the second signal to the second output terminal 54. As a result, not only the number of diodes used increases, but also the number of parts and wires for turning ON or OFF the diodes increases, with consequent complication of construction and difficulty in attaining the reduction of size.

SUMMARY OF THE INVENTION

The present invention has been accomplished in view of the above-mentioned points and it is an object of the invention to provide a signal switching circuit which permits the reduction in number of diodes used, thereby attaining the simplification of construction and the reduction of size.

For achieving the above-mentioned object, in a first aspect of the present invention there is provided a signal switching circuit comprising a first input terminal to which a first signal is inputted, a second input terminal to which a second signal is inputted, first and second output terminals from which the first or the second signal is outputted, first to fourth diode pairs each comprising two diodes which are connected together in series, the first to fourth diode pairs being disposed respectively between the first input terminal and the first output terminal, between the second input terminal and the first output terminal, between the first input terminal and the second output terminal, and between the second input terminal and the second output terminal, and first to fourth capacitor means connected respectively between diode-to-diode connection points in the respective diode pairs and the ground, wherein the first or the second diode pair is rendered conductive in an alternative manner, the third or the fourth diode pair is rendered conductive in an alternative manner, and a low pass filter for passing therethrough the corresponding first or second signal is constructed by residual inductance in each of the diode pairs thus rendered conductive and the associated capacitor means.

In a second aspect of the present invention there is provided, in combination with the above first aspect, a signal switching circuit wherein the first to fourth capacitor means are constructed by first to fourth strip lines respectively, one ends of the strip lines being connected respectively to the diode-to-diode connection points in the diode pairs, with the opposite ends thereof being made free, the length of each of the first and third strip lines is set shorter than a quarter wavelength of the first signal, and the length of each of the second and fourth strip lines is set shorter than a quarter wavelength of the second signal.

In a third aspect of the present invention there is provided, in combination with the above second aspect, a signal switching circuit wherein the two diodes in each of the diode pairs are connected together so that the directions of respective PN junctions are the same.

BRIEF DESCRIPTION OF THE DRAWINGS

FIG. 2 is an equivalent circuit diagram using diodes and a strip line in the signal switching circuit, with the diodes being ON;

DETAILED DESCRIPTION OF A PREFERRED EMBODIMENT

Figure 1:
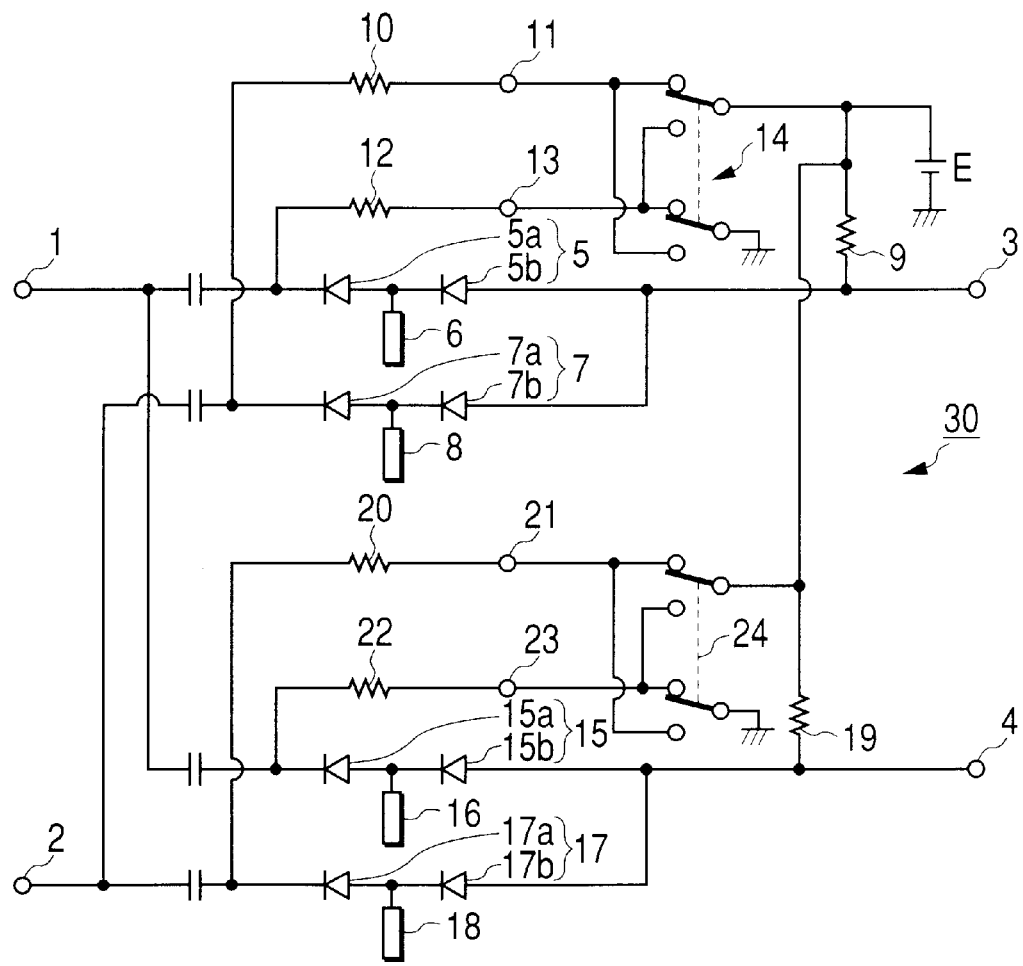
FIG. 1 is a circuit diagram showing the configuration of a signal switching circuit embodying the present invention.

A signal switching circuit embodying the present invention will be described hereinunder with reference to the accompanying drawings. First in FIG. 1, a first signal, say, a satellite broadcast signal of a counterclockwise circularly polarized wave is inputted to a first input terminal 1, while a second signal, say, a satellite broadcast signal of a clockwise circularly polarized wave is inputted to a second input terminal 2. Both signals are inputted from a down converter (not shown).

A first diode pair 5 comprising two diodes 5a and 5b is disposed between the first input terminal 1 and the first output terminal 3. The two diodes 5a and 5b are connected in series with each other so that the directions of respective PN junctions are the same. The first diode pair 5 is disposed so that the cathode and anode thereof lie on the first input terminal 1 side and the first output terminal 3 side, respectively, and so that the diodes 5a and 5b are located on the first input terminal 1 side and the first output terminal 3 side, respectively. One end of a first strip line 6 serving as a first capacitor means is connected to a connection point between the two diodes 5a and 5b, while the opposite end thereof is made free. The length of the first strip line 6 is set shorter than a quarter wavelength of the first signal.

A second diode pair 7 comprising two series-connected diodes 7a and 7b is disposed between the second input terminal 2 and the first output terminal 3. The two diodes 7a and 7b are connected in series with each other so that the directions of respective PN junctions are the same. The second diode pair 7 is disposed so that the cathode and anode thereof lie on the second input terminal 2 side and the first output terminal 3 side, respectively, and so that the diodes 7a and 7b are located on the second input terminal 2 side and the first output terminal 3 side, respectively. One end of a second strip line 8 serving as a second capacitor means is connected to a connection point between the two diodes 7a and 7b, while the opposite end thereof is made free. The length of the second strip line 8 is set shorter than a quarter wavelength of the second signal.

The voltage E is applied to the anodes of the diodes 5b and 7b through a resistor 9, the cathode of the diode 7a is connected to a first voltage application terminal 11 through a resistor 10, and the cathode of the diode 5a is connected to a second voltage application terminal 13 through a resistor 12. The voltage E is applied to the first and second voltage application terminals 11, 13 while switching the polarity of the voltage by means of a first change-over switch 14 of a two-circuit two-contact configuration.

Also between the first input terminal 1 and the second output terminal 4 is disposed a third diode pair 15 comprising two diodes 15a and 15b, the two diodes 15a and 15b being connected in series with each other so that the directions of respective PN junctions are the same. The third diode pair 15 is disposed so that the cathode and anode thereof lie on the first input terminal 1 side and the second output terminal 4 side, respectively, and so that the diodes 15a and 15b are located on the first input terminal 1 side and the second output terminal 4 side, respectively. One end of a third strip line 16 serving as a third capacitor means is connected to a connection point between the two diodes 15a and 15b, while the opposite end thereof is made free. The length of the third strip line 16 is set shorter than a quarter wavelength of the first signal.

Further, between the second input terminal 2 and the second output terminal 4 is disposed a fourth diode pair 17 comprising two diodes 17a and 17b, the two diodes 17a and 17b being connected in series with each other so that the directions of respective PN junctions are the same. The fourth diode pair 17 is disposed so that the cathode and anode thereof lie on the second input terminal 2 side and the second output terminal 4 side, respectively, and so that the diodes 17a and 17b are located on the second input terminal 2 side and the second output terminal 4 side, respectively. One end of a fourth strip line 18 serving as a fourth capacitor means is connected to a connection point between the two diodes 17a and 17b, while the opposite end thereof is made free. The length of the fourth strip line 18 is set shorter than a quarter wavelength of the second signal.

The voltage E is applied to the anodes of the diodes 15b and 17b through a resistor 19, the cathode of the diode 17a is connected to a third voltage application terminal 21 through a resistor 20, and the cathode of the diode 15a is connected to a fourth voltage application terminal 23 through a resistor 22. The voltage E is applied to the third and fourth voltage application terminals 21, 23 while switching the polarity of the voltage by means of a second change-over switch 24 of a two-circuit two-contact configuration.

In the signal switching circuit of this embodiment constructed as above, which is indicated at 30, for example when the voltage E is applied to the first voltage application terminal 11 and the second voltage application terminal 13 is grounded by the first change-over switch 14, the diodes 5a and 5b of the first diode pair 5 turn ON and the diodes 7a and 7b of the second diode pair 7 turn OFF.

As a result, the first signal which has been inputted to the first input terminal 1 is outputted to the first output terminal 3 through the first diode pair 5. At this time, the second signal inputted to the second input terminal 2 is not outputted.

Conversely, when the first voltage application terminal 11 is grounded and the voltage E is applied to the second voltage application terminal 13, the diodes 5a and 5b of the first diode pair 5 turn OFF and the diodes 7a and 7b of the second diode pair 7 turn ON.

As a result, the second signal which has been inputted to the second input terminal 2 is outputted to the first output terminal 3 through the second diode pair 7. At this time, the first signal inputted to the first input terminal 1 is not outputted.

Thus, the first signal inputted to the first input terminal 1 or the second signal inputted to the second input terminal 2 is outputted to the first output terminal 3. Likewise, the first signal inputted to the first input terminal 1 or the second signal inputted to the second input terminal 2 is outputted to the second output terminal 4.

Since the number of diodes used decreases, the number of resistors for the supply of voltage which is for turning ON or OFF becomes smaller, with consequent decrease in the number of wires used.

Figure 2:
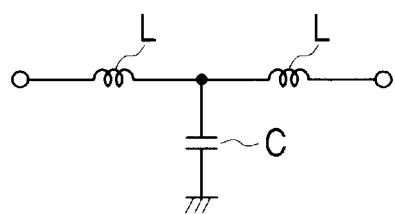

At the diodes 5a and 5b of the first diode pair 5 thus turned ON there appears a residual inductance L induced by their leads (terminals), so that such a T-shaped low pass filter as shown in FIG. 2 is constituted by the first diode pair 5 and the first strip line 6.

Likewise, also at the diodes 7a and 7b of the second diode pair 7 which has turned ON there appears a residual inductance L induced by their leads (terminals), so that such a T-shaped low pass filter as shown in FIG. 2 is constructed by the second diode pair 7 and the second strip line 8.

Therefore, by adjusting the lengths of the first and second strip lines 6, 8, their equivalent capacities C are set appropriately and a cut-off frequency of the low pass filter constructed by the first diode pair 5 and the first strip line 6 is set higher than the frequency of the first signal, further, a cut-off frequency of the low pass filter constituted by the second diode pair 7 and the second strip line 8 is set higher than the frequency of the second signal.

Figure 3:
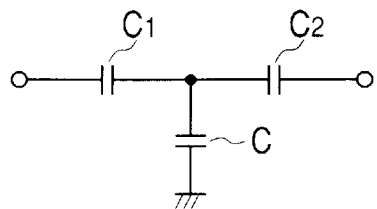
FIG. 3 is an equivalent circuit diagram using diodes and a strip line in the signal switching circuit, with the diodes being OFF.

Upon turning OFF of the two diodes 5a and 5b of the first diode pair 5 and the two diodes 7a and 7b of the second diode pair 7, since these diodes have a slight capacitance, such an equivalent circuit as shown in FIG. 3 is constructed by the first diode pair 5 and the first strip line 6 and also by the second diode pair 7 and the second strip line 8. In the same figure, C1 stands for a slight capacitance induced by the diode 5a or 7a and C2 stands for a slight capacitance induced by the diode 5b or 7b. Thus, the level of the first or the second signal is divided by C1 and C2 and is therefore becomes low at the first output terminal 3. Consequently, the level ratio between the first and second signals at each output terminal becomes large, affording a sufficient isolation.

Figure 4:
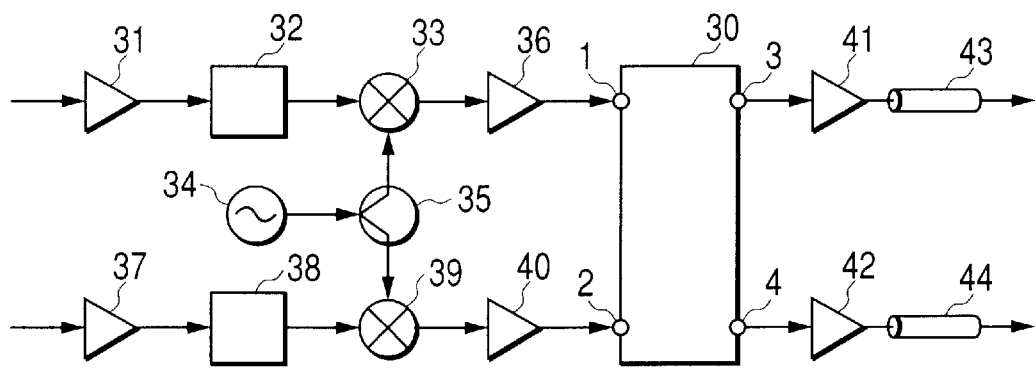
FIG. 4 is a block configuration diagram showing the configuration of a satellite broadcast receiving outdoor converter using the signal switching circuit.
Figure 5:
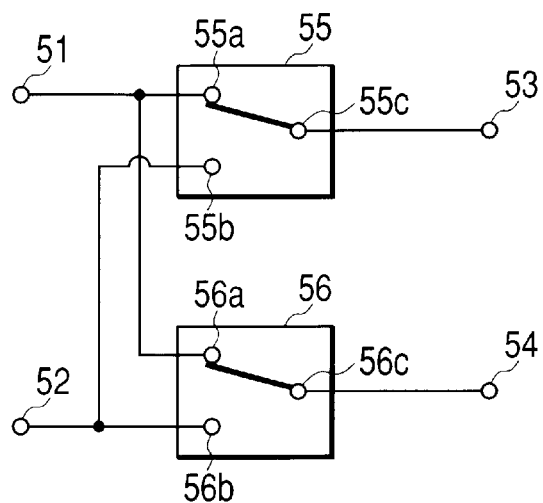
FIG. 5 is a circuit diagram showing the configuration of a conventional signal switching circuit.
Figure 6:
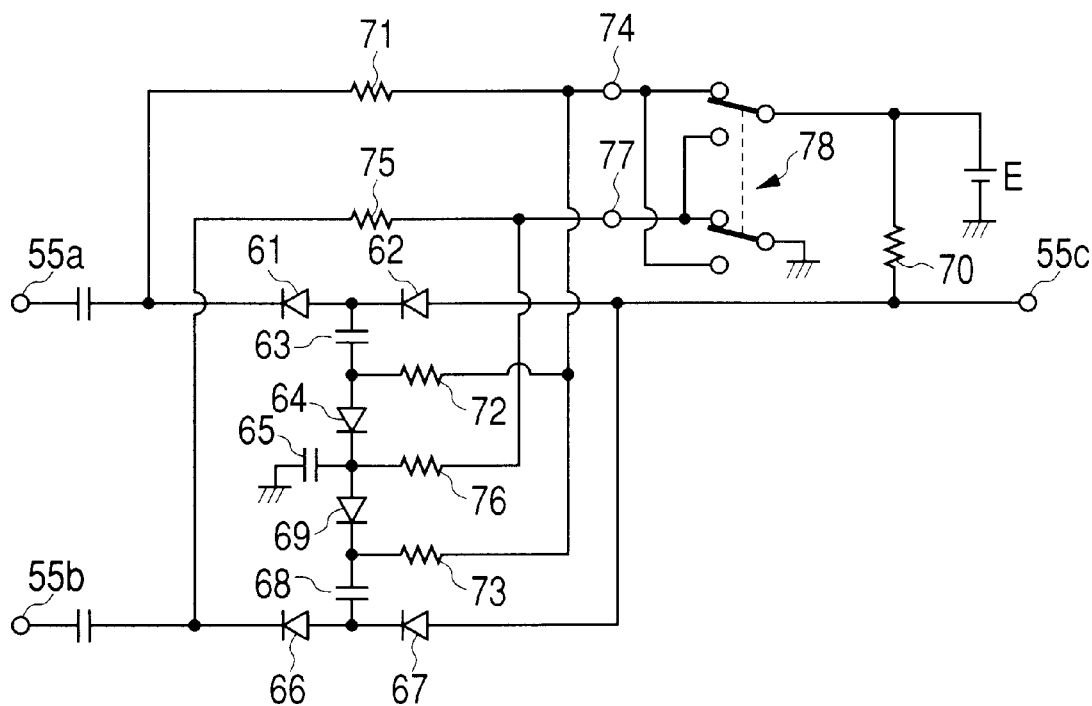
FIG. 6 is a circuit diagram showing a concrete configuration of a switch circuit in the conventional signal switching circuit.

The signal switching circuit 30 of this embodiment described above is incorporated in a satellite broadcast receiving outdoor converter as shown in FIG. 4. In the same figure, a counterclockwise satellite broadcast signal of approximately 12 GHz as the first signal is inputted to a first low-noise amplifier 31 and is fed to a first mixer 33 through a first band-pass filter 32. On the other hand, a local oscillation signal outputted from a local oscillator 34 is inputted to the first mixer 33 through a distributor 35. Then, a first intermediate frequency signal of approximately 1 GHz is outputted from the first mixer 33. The first intermediate frequency signal is fed to the first input terminal 1 of the signal switching circuit 30 through a first intermediate frequency amplifier 36.

On the other hand, a clockwise satellite broadcast signal of approximately 12 GHz as the second signal is inputted to a second low-noise amplifier 37 and is fed to a second mixer 39 through a second band-pass filter 38. The local oscillation signal is also fed to the second mixer 39 from the distributor 35. An intermediate frequency signal outputted from the second mixer 39 is inputted to the second input terminal 2 of the signal switching circuit 30 through a second intermediate frequency amplifier 40.

A first output amplifier 41 is connected to the first output terminal 3 of the signal switching circuit 30, while a second output amplifier 42 is connected to the second output terminal 4. Further, cables 43 and 44, which are drawn into a first room, are connected to the first and second output amplifiers 41, 42, respectively. Within the room are installed channel selectors (not shown) which are connected to the cables 43 and 44, respectively. Switching operations of the first and second change-over switches 14, 24 in the signal switching circuit 30 are controlled by the channel selectors.

In the signal switching circuit according to the present invention, as set forth above, first to fourth diode pairs each comprising two series-connected diodes are disposed respectively between the first input terminal and the first output terminal, between the second input terminal and the first output terminal, between the first input terminal and the second output terminal, and between the second input terminal and the second output terminal; first to fourth capacitor means each connected between a diode-to-diode connection point in each of the diode pairs and the ground are provided; the first or the second diode pair is rendered conductive in an alternative manner and the third or the fourth diode pair is rendered conductive in an alternative manner; and by residual inductance in each of the diode pairs thus rendered conductive and the associated capacitor means there is constructed a low pass filter for passing therethrough the first or the second signal. Therefore, when each diode pair is turned OFF, the level of the signal leaking from the diodes is divided by the diodes and the associated capacitor means, so even if the number of diodes used is small, there can be attained sufficient isolation between the first and second signals at each output terminal.

Besides, such a reduction in the number of diodes results in a decrease in the number of parts and wires for turning ON and OFF the diodes, whereby the circuit configuration is simplified and it is possible to attain the reduction of size.

Moreover, the first to fourth capacitor means are constructed by the first to fourth strip lines respectively, one end of each strip line is connected to a diode-to-diode connection point in each diode pair and the opposite end thereof is made free, the length of each of the first and third strip lines is set shorter than a quarter wavelength of the first signal, and the length of each of the second and fourth strip lines is set shorter than a quarter wavelength of the second signal. Thus, it is not necessary to use separate parts as capacitor means and therefore it is possible to further simplify the construction and attain the reduction of both size and cost.

Further, since the two diodes in each diode pair are connected together so that the directions of respective PN junctions are the same, there can be attained simplification in point of wiring for the application of voltage to each diode.

What is claimed is:
1. A signal switching circuit comprising:
a first input terminal to which a first signal is inputted;
a second input terminal to which a second signal is inputted;
first and second output terminals from which one of the first and the second signals is outputted, first to fourth diode pairs each comprising two diodes which are connected together in series, the first to fourth diode pairs being disposed respectively between the first input terminal and the first output terminal, between the second input terminal and the first output terminal, between the first input terminal and the second output terminal, and between the second input terminal and the second output terminal; and first to fourth capacitor circuits connected respectively between diode-to-diode connection points in the respective diode pairs and the ground, wherein one of the first and the second diode pairs is rendered conductive in an alternative manner, one of the third and the fourth diode pairs is rendered conductive in an alternative manner, and a low pass filter for passing therethrough the corresponding first or second signal includes residual inductance in each of the diode pairs thus rendered conductive and the associated capacitor circuit.

2. A signal switching circuit according to claim 1, wherein the first to fourth capacitor circuits comprise first to fourth strip lines respectively, one end of the strip lines being connected respectively to the diode-to-diode connection points in the diode pairs, with the opposite end of the first to fourth strip lines thereof being made free, a length of each of the first and third strip lines is shorter than a quarter wavelength of the first signal, and a length of each of the second and fourth strip lines is shorter than a quarter wavelength of the second signal.

3. A signal switching circuit according to claim 2, wherein the two diodes in each of the diode pairs are connected together so that the directions of respective PN junctions are the same.

* * * * *